US010109745B2

(12) United States Patent
Ko et al.

(10) Patent No.: US 10,109,745 B2
(45) Date of Patent: Oct. 23, 2018

(54) METHOD OF MANUFACTURING FLEXIBLE DISPLAY

(71) Applicant: Samsung Display Co., Ltd., Yongin-si, Gyeonggi-do (KR)

(72) Inventors: Jisung Ko, Yongin-si (KR); Youngji Kim, Yongin-si (KR); Jongseong Kim, Yongin-si (KR); Taehyun Sung, Yongin-si (KR); Hyungu Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 550 days.

(21) Appl. No.: 14/918,023

(22) Filed: Oct. 20, 2015

(65) Prior Publication Data

US 2016/0351859 A1 Dec. 1, 2016

(30) Foreign Application Priority Data

Jun. 1, 2015 (KR) ........................ 10-2015-0077481

(51) Int. Cl.
| B23K 26/362 | (2014.01) |
| B23K 26/364 | (2014.01) |
| H01L 51/56 | (2006.01) |
| H01L 51/52 | (2006.01) |
| H01L 29/786 | (2006.01) |
| H01L 27/32 | (2006.01) |
| H01L 51/00 | (2006.01) |
| H01L 51/50 | (2006.01) |
| H01L 27/12 | (2006.01) |

(52) U.S. Cl.
CPC ...... *H01L 29/7869* (2013.01); *H01L 27/1218* (2013.01); *H01L 27/1225* (2013.01); *H01L 27/1262* (2013.01); *H01L 51/0097* (2013.01); *H01L 51/524* (2013.01); *H01L 2251/5338* (2013.01); *Y02E 10/549* (2013.01); *Y02P 70/521* (2015.11)

(58) Field of Classification Search
CPC .............. B23K 26/0066; B23K 26/359; B23K 26/362; B23K 26/364; H01L 51/56; H01L 51/0097; H01L 51/5012; H01L 29/7869; H01L 27/3211; H01L 51/5253
USPC ....................................... 219/121.85, 121.11
See application file for complete search history.

(56) References Cited

U.S. PATENT DOCUMENTS

| 8,890,025 B2 * | 11/2014 | Panarello ........... B23K 26/0635 |
| | | 219/121.69 |
| 2013/0216740 A1 | 8/2013 | Russell-Clarke et al. |
| 2015/0049891 A1 | 2/2015 | Johnson et al. |

FOREIGN PATENT DOCUMENTS

| JP | 6-310499 A | 11/1994 |
| KR | 10-2014-0017119 A | 2/2014 |
| KR | 10-2014-0080238 A | 6/2014 |
| KR | 10-2014-0148176 A | 12/2014 |

* cited by examiner

*Primary Examiner* — Samuel M Heinrich

(57) ABSTRACT

A method of manufacturing a flexible display is disclosed. In one aspect, the method includes attaching a protective film to a flexible display panel. The flexible display panel includes a bending region along which the flexible display panel is configured to be bent. The method also includes removing a portion of the protective film that corresponds to the bending region and bending the flexible display panel along the bending region.

11 Claims, 7 Drawing Sheets

METHOD OF MANUFACTURING FLEXIBLE DISPLAY

INCORPORATION BY REFERENCE TO ANY PRIORITY APPLICATIONS

This application claims the benefit of Korean Patent Application No. 10-2015-0077481, filed on Jun. 1, 2015, in the Korean Intellectual Property Office, the disclosure of which is incorporated herein in its entirety by reference.

BACKGROUND

Field

One or more exemplary embodiments generally relate to a method of manufacturing a flexible display, and more particularly, to a method of attaching a protective film to a flexible display panel.

Description of the Related Technology

Flexible display panels are formed to be flexible by forming a device layer which can display images over a flexible substrate. Such flexible display panels have an advantage over standard rigid display panels in that they can be easily bent or selectively deformed from a flat configuration when necessary. A protective film for protecting the flexible display panel is attached to at least one surface thereof.

SUMMARY OF CERTAIN INVENTIVE ASPECTS

One inventive aspect is a method of manufacturing a flexible display.

Additional aspects will be set forth in part in the description which follows and, in part, will be apparent from the description, or may be learned by practice of the presented embodiments Another aspect is a method of manufacturing a flexible display including attaching a protective film to a flexible panel; removing a portion of the protective film that corresponds to a bending portion; and forming the flexible panel by bending the bending portion.

The removing of the portion of the protective film that corresponds to the bending portion can include emitting laser light onto the portion of the protective film that corresponds to the bending portion.

The emitting of the laser light can include dividing the portion of the protective film that corresponds to the bending portion into a plurality of sections and sequentially scanning the plurality of sections. Alternatively, the emitting of the laser light can include scanning the entire portion of the protective film that corresponds to the bending portion at one time.

The laser light can be emitted while scanning one of the plurality of sections of the protective film in one direction, and then can be emitted while scanning an adjacent section in the one direction.

The laser light can be emitted while scanning the entire portion of the protective film that corresponds to the bending portion in one direction.

Even after the removing of the portion of the protective film that corresponds to the bending portion, the portion of the protective film that corresponds to the bending portion can partially remain not to expose the flexible panel.

The laser light can be emitting from a laser which includes any type of laser selected from the following: a $CO_2$ laser, a green laser, an infrared laser, and an ultraviolet laser.

The method can further include providing the flexible panel on a housing.

After the forming of the flexible panel by bending the bending portion, the flexible panel can be provided on the housing.

The forming of the flexible panel by bending the bending portion can be performed while providing the flexible panel on the housing.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF CERTAIN INVENTIVE EMBODIMENTS

Figure 1:
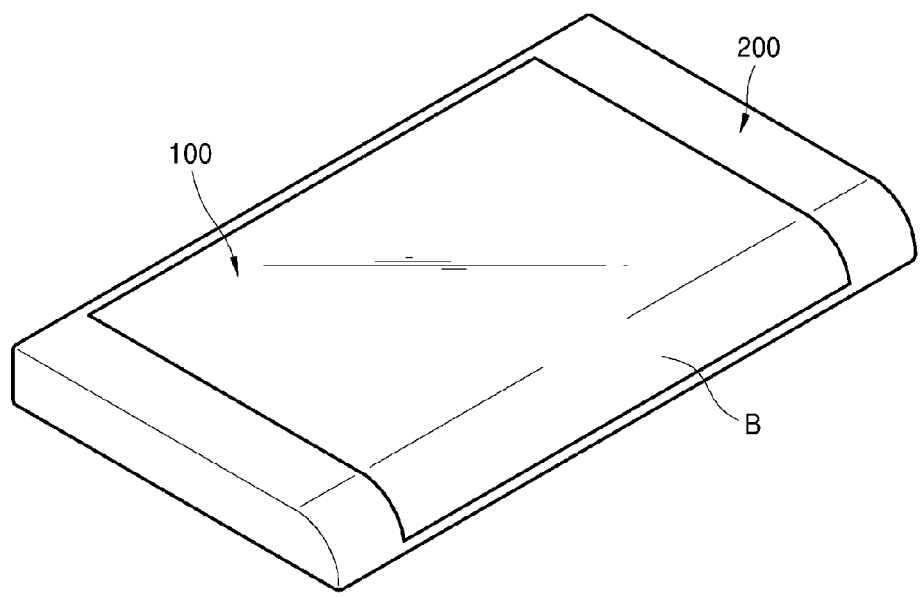
FIG. 1 is a perspective view of a flexible display according to an exemplary embodiment.

The described technology may include various embodiments and modifications, and exemplary embodiments thereof will be illustrated in the drawings and will be described herein in detail. The effects and features of the described technology and the accompanying methods thereof will become apparent from the following description of the embodiments, taken in conjunction with the accompanying drawings. However, the described technology is not limited to the embodiments described below, and may be embodied in various modes.

Reference will now be made in detail to embodiments, examples of which are illustrated n the accompanying drawings. In the drawings, the same elements are denoted by the same reference numerals, and a repeated explanation thereof will not be given.

As used herein, the singular forms "a", "an" and "the" are intended to include the plural forms as well, unless the context clearly indicates otherwise.

It will be further understood that the terms "comprises" and/or "comprising", when used in this specification, specify the presence of stated features or elements, but do not preclude the presence or addition of one or more other features or elements.

It will also be understood that when a layer, a region, or an element is referred to as being "on" another layer, region, or element, it can be directly on the other layer, region, or element, or intervening layers, regions, or elements may also be present therebetween.

Sizes of elements may be exaggerated for the sake of clarity. In other words, since the sizes and thicknesses of elements in the drawings may be exaggerated, the following embodiments are not limited thereto.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

FIG. 1 is a perspective view of a flexible display manufactured according to an exemplary embodiment.

In the embodiment of FIG. 1, the flexible display includes a flexible panel or flexible display panel 100, which is flexible, provided on a housing or support structure 200.

An end portion of the flexible panel 100 can be bent along a bending portion or bending region B, so that the end portion of the flexible panel 100 can be viewed from the side of the housing 200.

Figure 2:
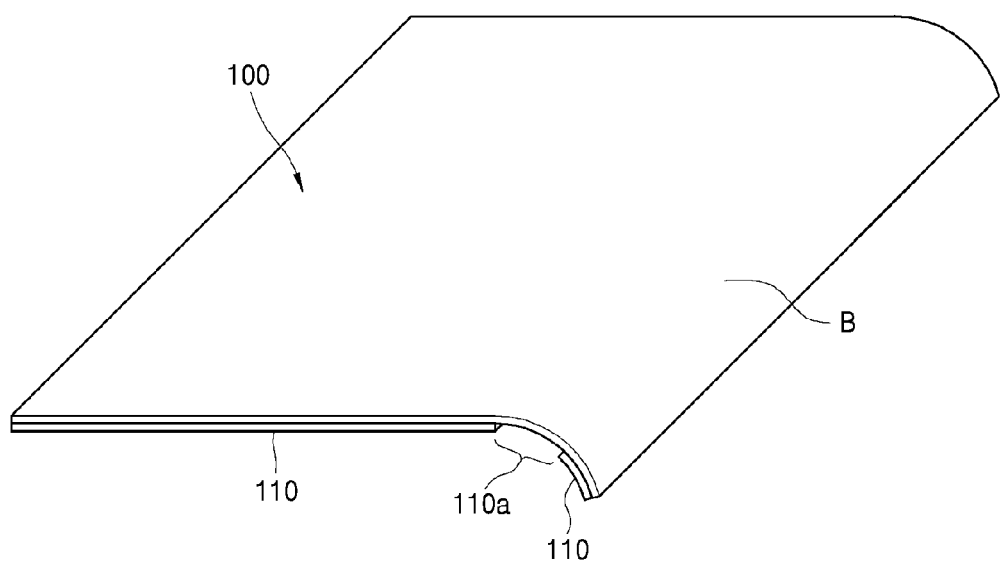
FIG. 2 is a perspective view of a flexible panel of the flexible display of FIG. 1.

FIG. 2 is a perspective view of the flexible panel 100. Since the flexible panel 100 is formed using a flexible substrate, the flexible panel 100 can be freely bent within an allowable range defined by its flexibility. Accordingly, the flexible panel 100 can be formed by bending the end portion of the flexible panel 100 along the bending portion B as shown in FIG. 2.

Reference numeral 110 denotes a protective film that is attached to a bottom surface of the flexible panel 100. A portion 110a of the protective film 110 that corresponds to the bending portion B is removed in order to prevent the protective film 110 from being detached from the flexible panel 100 due to a compressive stress generated when the flexible panel 100 is bent.

A method of attaching the protective film 110 to the flexible panel 100 and removing the portion 110a of the protective film 110 that corresponds to the bending portion B will be explained below, and an inner structure of the flexible panel 100 will now be explained briefly.

Figure 5:
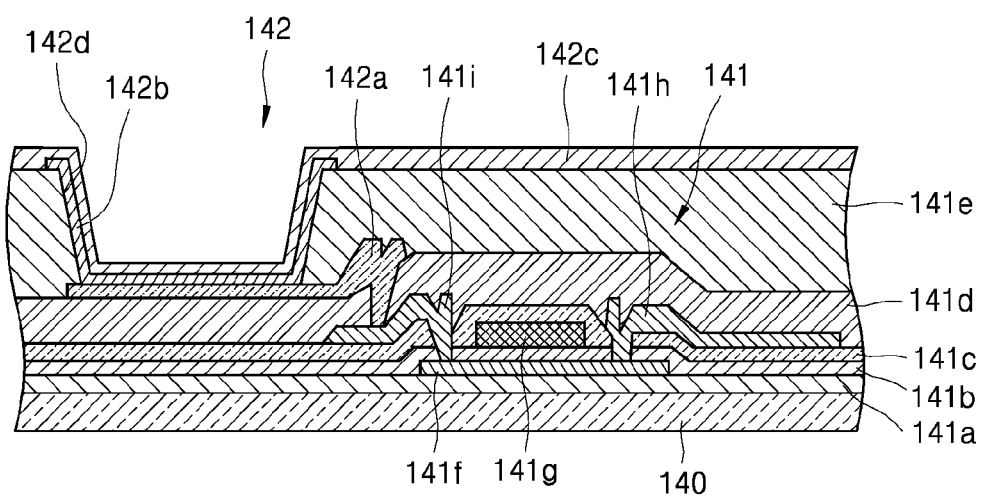
FIG. 5 is a cross-sectional view illustrating an inner structure of the flexible panel of FIG. 1.

Referring to FIG. 5, a thin-film transistor (TFT) 141 and an electroluminescent (EL) device 142 (such as an organic light-emitting diode (OLED)) are formed in the flexible panel 100. In detail, an active layer 141f is formed on a buffer layer 141a that is formed on a flexible substrate 140. The active layer 141f has a source region and a drain region heavily doped with N- and/or P-type impurities. The active layer 141f can be formed of an oxide semiconductor. For example, the oxide semiconductor can include an oxide of a material from group 12, 13, and 14 metal elements such as zinc (Zn), indium (In), gallium (Ga), tin (Sn), cadmium (Cd), germanium (Ge), and hafnium (Hf) and a combination thereof. For example, the active layer 141f can include I-G-Z—O[(In$_2$O$_3$)a(Ga$_2$O$_3$)b(ZnO)c] (where a, b, and c are real numbers respectively satisfying a≥0, b≥0, and c>0). A gate electrode 141g is formed over the active layer 141f with a gate insulating film 141b interposed therebetween. A source electrode 141h and a drain electrode 141i are formed over the gate electrode 141g. An interlayer insulating film 141c is formed between the gate electrode 141g and the source and drain electrodes 141h and 141i, and a passivation film 141d is formed between an anode 142a of the EL device 142 and the source and drain electrodes 141h and 141i.

An insulating planarization film 141e including acryl or the like is formed on the anode 142a. After a predetermined opening 142d is formed in the insulating planarization film 141e, the EL device 142 is formed.

The EL device 142 can display predetermined image information by emitting red, green, and/or blue light according to the flow of electric current. The EL device 142 includes the anode 142a that is connected to the drain electrode 141i of the TFT 141 and receives positive electric power from the drain electrode 141i, a cathode 142c that is formed to cover all pixels and supplies negative electric power, and an emission layer 142b that is interposed between the anode 142a and the cathode 142c and emits light.

A hole injection layer (HIL), a hole transport layer (HTL), an electron transport layer (ETL), and an electron injection layer (EIL) can be stacked adjacent to the emission layer 142b.

For reference, the emission layer 142b can be separately formed in each sub-pixel so that sub-pixels emitting red, green, and blue light form one unit pixel. Alternatively, the emission layer 142b can be formed commonly over an entire pixel region irrespective of locations of the sub-pixels. In this case, the emission layer 142b can be formed by vertically stacking or combining layers including, for example, red, green, and blue light-emitting materials. As long as white light can be emitted, other color emitting materials can be used in the stack of layers. Also, a color conversion layer or a color filter for converting the white light into predetermined color light can be further provided.

Since the emission layer 142b is very vulnerable to degradation due to moisture, for example, a thin-film encapsulation layer (not shown) in which an organic film and an inorganic film are alternately stacked can be formed on the cathode 142c to protect the emission layer 142b.

A process of attaching the protective film 110 to the flexible panel 100 and bending the flexible panel 100 can be performed as shown in FIGS. 3A through 3D.

Figure 3A:
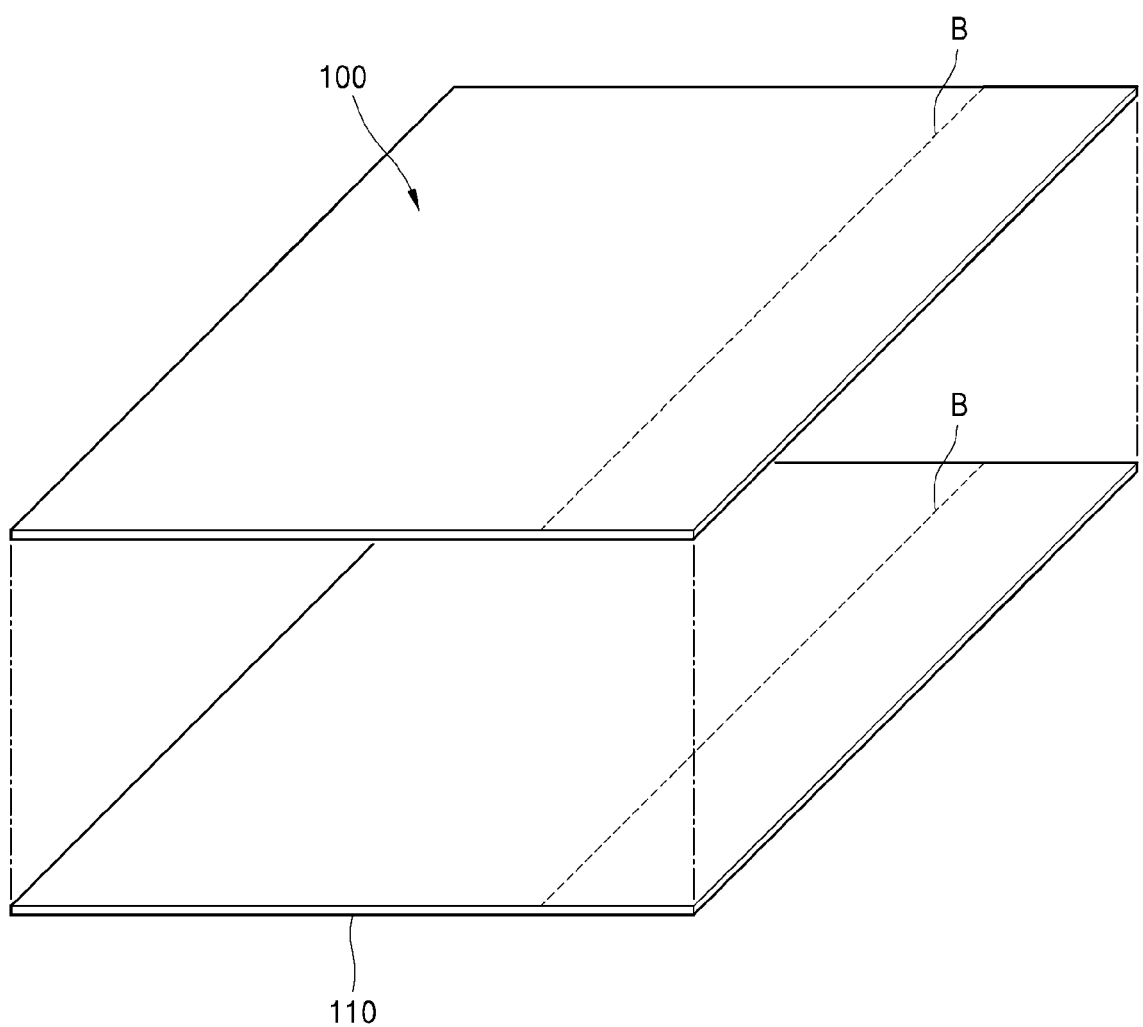
FIGS. 3A through 3D are views illustrating a process of attaching a protective film to the flexible panel of FIG. 2 and bending the flexible panel.

First, as shown in FIG. 3A, the protective film 110 is attached to the flexible panel 100. In this embodiment, irrespective of the bending portion B, the protective film 110 is attached to an entire surface of the flexible panel 100.

Figure 3B:
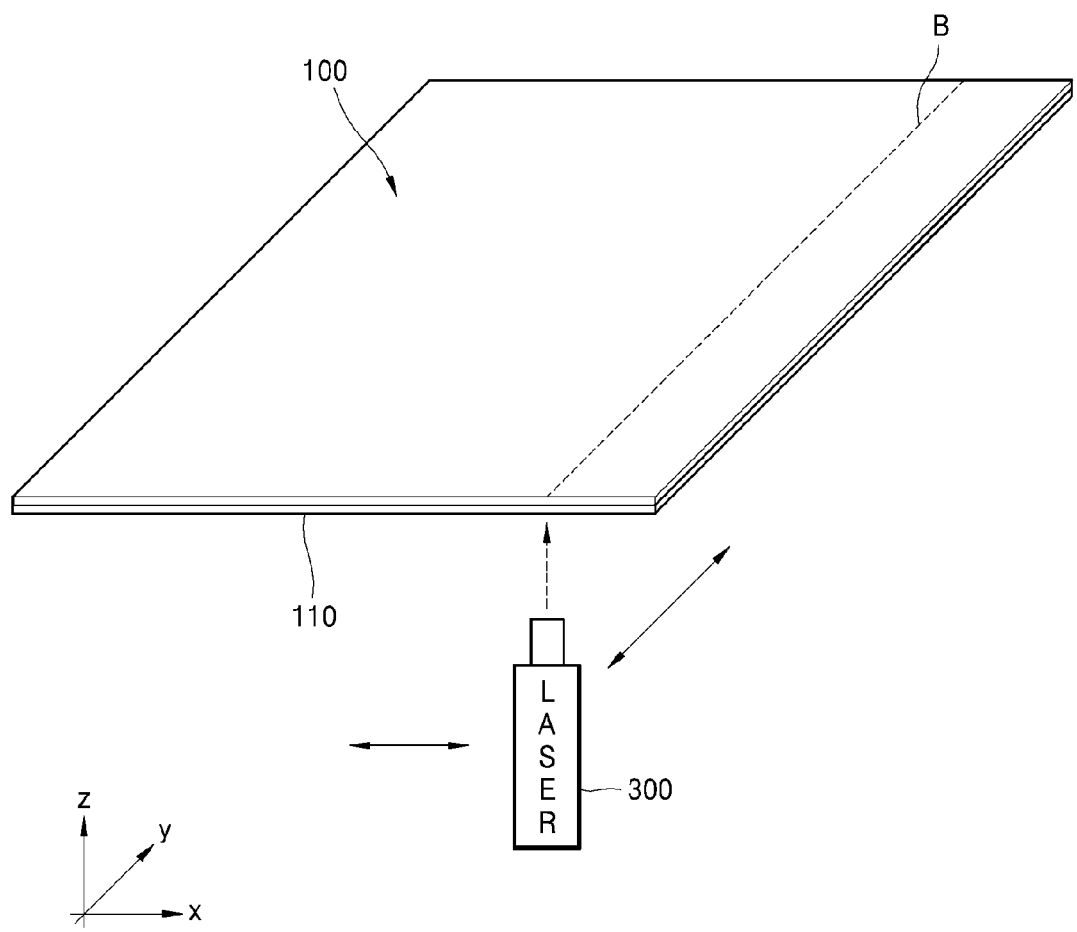

Next, as shown in FIG. 3B, the portion 110a of the protective film 110 that corresponds to the bending portion B is removed. That is, the portion 110a of the protective film 110 that corresponds to the bending portion B is removed by emitting light from a laser device or laser 300 to the portion 110a of the protective film 110. In this embodiment, the laser device 300 can emit the light while scanning the protective film 110 along a Y-axis of FIG. 3B, or can divide the portion 110a of the protective film 110 into a plurality of sections and can emit the light while moving slightly along an X-axis.

Figure 4A:
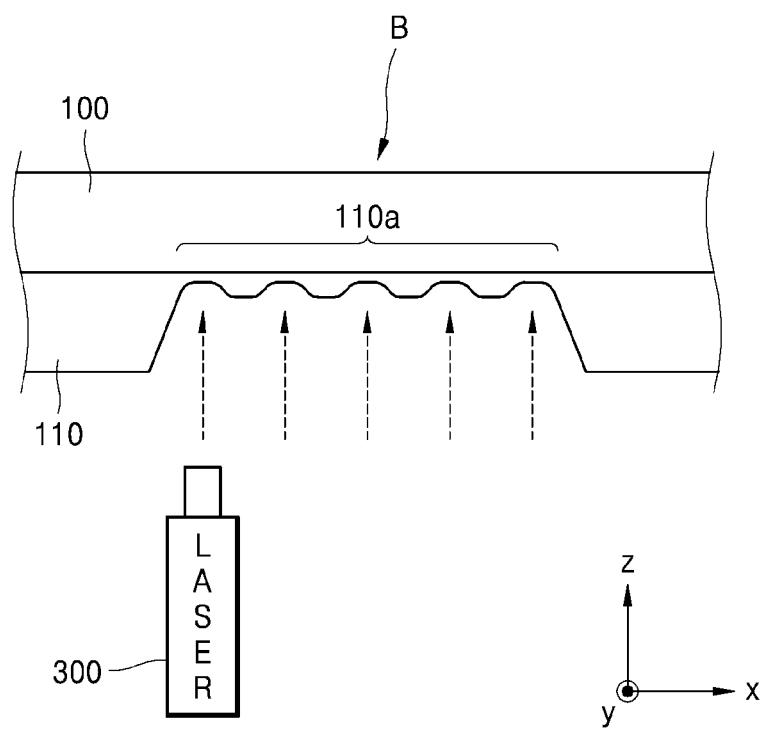
FIGS. 4A and 4B are views illustrating a method of emitting a laser to remove a portion of the protective film as shown in FIG. 3B.

That is, as shown in FIG. 4A, instead of scanning the portion 110a of the protective film 110 that corresponds to the bending portion B in a single pass, the portion 110a of the protective film 110 can be divided into a plurality of sections and the laser device 300 can emit light while scanning one section along the Y-axis, can move slightly along the X-axis, and then can emit light while scanning a subsequent section along the Y-axis, to remove the portion 110a of the protective film 110.

Figure 4B:
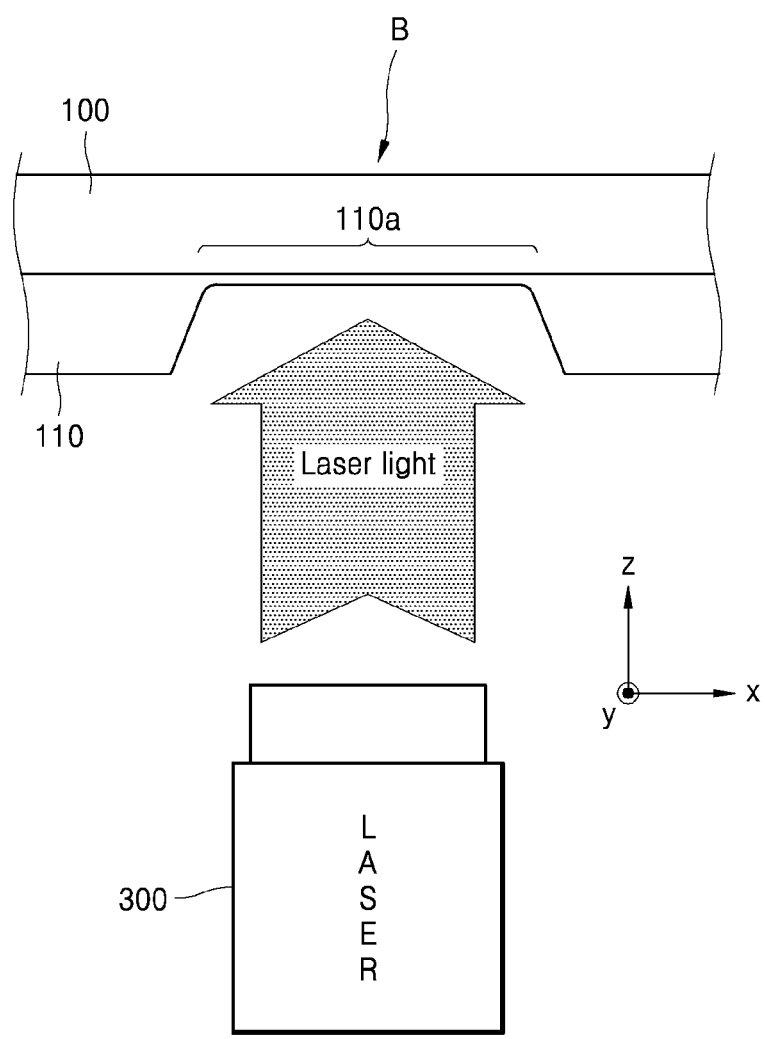

Alternatively, as shown in FIG. 4B, the portion 110a of the protective film 110 that corresponds to the bending portion B can be scanned along the Y-axis in one pass. However, in order to clearly form a boundary line between the portion 110a and other portions of the protective film 110, it may be desirable to divide the portion 110a into a plurality of sections and then scan each of the plurality of sections as shown in FIG. 4A.

Figure 3C:
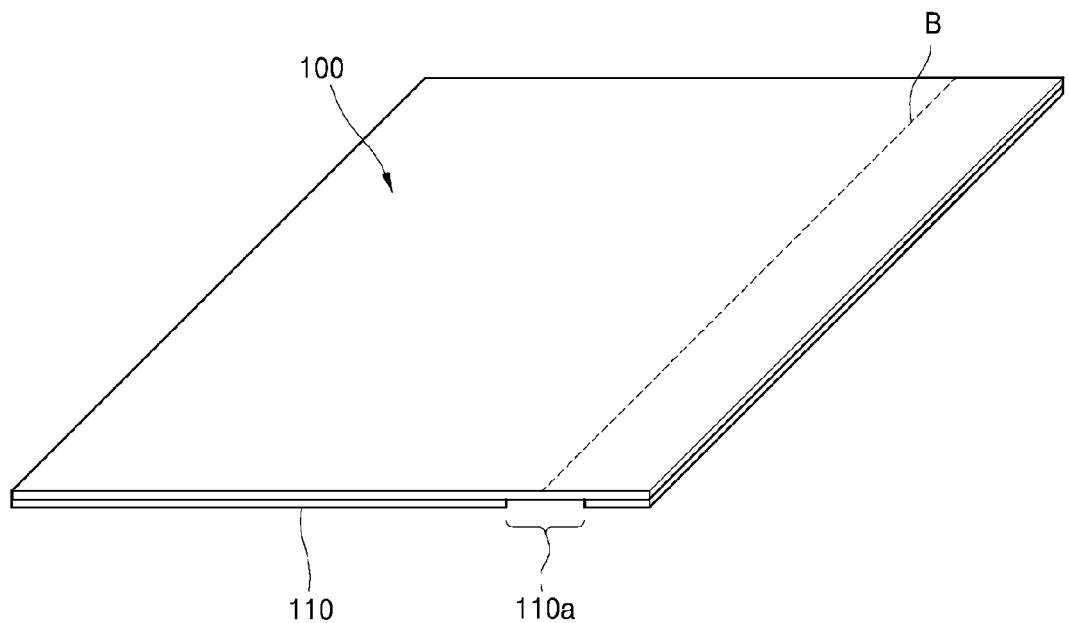
Figure 3D:
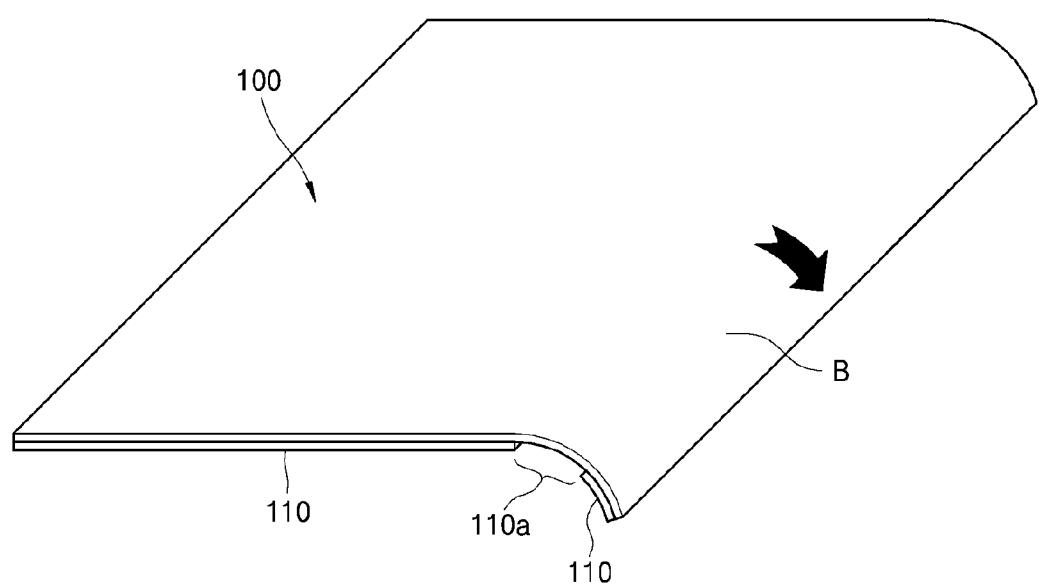

Accordingly, the portion 110a of the protective film 110 that corresponds to the bending portion B is removed as shown in FIG. 3C, and then the bending portion B is bent to form the flexible panel 100 having an end portion is bent as shown in FIG. 3D. When the flexible panel 100 is mounted on the housing 200, the flexible display of FIG. 1 is realized. In other exemplary embodiments, the flexible panel 100 can be bent while being mounted on the housing 200, instead of being previously bent and formed.

When the protective film 110 is attached to the flexible panel 100 and the flexible panel 100 is bent in the above process, since the protective film 110 is first attached to the entire surface of the flexible panel 100 and then the portion 110a corresponding to the bending portion B is removed, the entire process can be very conveniently and reliably performed.

When the portion 110a of the protective film 110 that corresponds to the bending portion B is removed and then the protective film 110 is attached to the flexible panel 100, since both portions of the protective film 110 obtained by removing the portion 110a have to be accurately aligned with the flexible panel 100, it can be difficult to attach the protective film 110 to the flexible panel 100. However, according to the present exemplary embodiment, since the protective film 110 is first attached to the entire surface of the flexible panel 100 and then the portion 110a corresponding to the bending portion B is removed, the burden of aligning the protective film 110 with the flexible panel 100 when attaching the protective film 110 to the flexible panel 100 is reduced, thereby simplifying the entire process.

Also, as shown in FIGS. 4A and 4B, since the portion 110a of the protective film 110 that corresponds to the bending portion B may not be completely removed and may partially remain by adjusting the depth at which the laser light penetrates the protective film, the flexible panel 100 can be sufficiently separated from the bending portion B of the flexible panel 100 due to the remaining sub-portion of the portion 110a of the protective film 110.

Hence, when a flexible display is manufactured by using the afore-described method, a process of attaching a protective film to a flexible panel can be very conveniently and reliably performed, thereby greatly improving work efficiency.

Laser light that is emitted to remove the portion 110a of the protective film 110 can be any one of the following: a $CO_2$ laser, a green laser, an infrared laser, an ultraviolet laser, or any combination thereof.

While the inventive technology has been particularly shown and described with reference to exemplary embodiments thereof, they are provided for the purposes of illustration and it will be understood by those of ordinary skill in the art that various modifications and equivalent other embodiments can be made from the inventive technology. Accordingly, the true technical scope of the invention is defined by the technical spirit of the appended claims.

What is claimed is:

1. A method of manufacturing a flexible display, comprising:

attaching a protective film to a flexible display panel, wherein the flexible display panel includes a bending region along which the flexible display panel is configured to be bent;

removing a portion of the protective film that corresponds to the bending region; and bending the flexible display panel along the bending region.

2. The method of claim 1, wherein the removing of the portion of the protective film comprises irradiating with laser light the portion of the protective film that corresponds to the bending region.

3. The method of claim 2, wherein the irradiating the portion of the protective film comprises dividing the portion of the protective film into a plurality of sections and sequentially scanning the plurality of sections with the laser light.

4. The method of claim 3, wherein the laser light is irradiated onto one of the plurality of sections of the protective film while scanning along the corresponding section of the protective film in one direction, and then the laser light is irradiated onto an adjacent section of the protective film while scanning the adjacent section in the one direction.

5. The method of claim 2, wherein the irradiating the portion of the protective film comprises scanning the entire area of the protective film that corresponds to the bending region in a single pass.

6. The method of claim 5, wherein the portion of the protective film is irradiated while scanning the entire area of the protective film that corresponds to the bending region in one direction.

7. The method of claim 2, wherein the laser light is emitted from a laser selected from one of the following: a $CO_2$ laser, a green laser, an infrared laser, and an ultraviolet laser.

8. The method of claim 1, wherein the removing of the portion of the protective film that corresponds to the bending region comprises only partially removing the portion of the protective film such that at least a sub-portion of the portion of the protective film remains covering the flexible display panel over the entire portion of the protective film that corresponds to the bending region.

9. The method of claim 1, further comprising placing the flexible display panel over a support structure.

10. The method of claim 9, wherein the placing of the flexible display panel over the support structure is performed after the bending of the flexible display panel along the bending region.

11. The method of claim 9, wherein the bending of the flexible display panel along the bending portion is performed simultaneously with the placing of the flexible display panel over the support structure.

* * * * *